United States Patent
Borthakur

(10) Patent No.: US 9,635,325 B2
(45) Date of Patent: Apr. 25, 2017

(54) SYSTEMS AND METHODS FOR DETECTING ULTRAVIOLET LIGHT USING IMAGE SENSORS

(71) Applicant: SEMICONDUCTOR COMPONENTS INDUSTRIES, LLC, Phoenix, AZ (US)

(72) Inventor: Swarnal Borthakur, Boise, ID (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 13 days.

(21) Appl. No.: 14/725,121

(22) Filed: May 29, 2015

(65) Prior Publication Data
US 2016/0351609 A1    Dec. 1, 2016

(51) Int. Cl.
*H01L 27/146* (2006.01)
*H04N 9/04* (2006.01)

(52) U.S. Cl.
CPC ....... *H04N 9/045* (2013.01); *H01L 27/14621* (2013.01); *H01L 27/14627* (2013.01); *H01L 27/14663* (2013.01); *H01L 27/14623* (2013.01); *H04N 2209/045* (2013.01)

(58) Field of Classification Search
CPC ......... H01L 27/14621; H01L 27/14625; H01L 27/14627; H01L 27/14645; H01L 31/02322; H01L 31/09; H04N 9/045; H04N 2209/045; G01J 1/429
See application file for complete search history.

(56) References Cited

U.S. PATENT DOCUMENTS

| | | | | |
|---|---|---|---|---|
| 4,051,374 A | * | 9/1977 | Drexhage | H01L 27/14868 250/370.08 |
| 4,577,098 A | * | 3/1986 | Ogawa | H04N 9/045 250/208.1 |
| 5,990,506 A | * | 11/1999 | Fossum | G11C 19/282 250/206 |

(Continued)

OTHER PUBLICATIONS

Geyer et al., "Multispectral imaging via luminescent down-shifting with colloidal quantum dots," Optical Materials Express, Aug. 2013.*

(Continued)

*Primary Examiner* — Dennis Hogue
(74) *Attorney, Agent, or Firm* — Treyz Law Group, P.C.; Zachary D. Hadd

(57) ABSTRACT

An imaging system may include an image sensor having an array of image pixels with a photosensitive region that generates image signals in response to light. The array may include photoluminescent material that absorbs light of a first range of wavelengths and emits light of a second range of wavelengths onto the photosensitive region. The first range of wavelengths may correspond to ultraviolet light, and the second range of wavelengths may correspond to visible light. The photoluminescent material may be formed over some or all of the image pixels. The array may include color filter elements that transmit light of a given color to the photosensitive region. The photoluminescent material may be adjusted to have a peak emission intensity at a color of light that corresponds to the given color of light transmitted by a given color filter element.

13 Claims, 11 Drawing Sheets

(56) References Cited

U.S. PATENT DOCUMENTS

| | | | |
|---|---|---|---|
| 6,064,069 A * | 5/2000 | Nakano | H01L 27/14625 |
| | | | 250/370.08 |
| 6,078,052 A | 6/2000 | DiFilippo | |
| 7,375,803 B1 | 5/2008 | Bamji | |
| 7,830,434 B2 * | 11/2010 | Li | H01L 27/14621 |
| | | | 250/581 |
| 7,834,956 B2 | 11/2010 | Keam et al. | |
| 2003/0133029 A1 * | 7/2003 | Booth, Jr. | H01L 27/14609 |
| | | | 348/294 |
| 2008/0074505 A1 * | 3/2008 | Ryde | H01L 27/14621 |
| | | | 348/218.1 |
| 2012/0001289 A1 * | 1/2012 | Ahn | H01L 27/14621 |
| | | | 257/432 |
| 2012/0236190 A1 * | 9/2012 | Ogasahara | G02B 3/0056 |
| | | | 348/302 |
| 2013/0329101 A1 * | 12/2013 | Choi | H04N 9/045 |
| | | | 348/273 |
| 2014/0160080 A1 | 6/2014 | Craft | |

OTHER PUBLICATIONS

Kuroda et al., "A FSI CMOS Image Sensor with 200-1000 nm Spectral Response and High Robustness to Ultraviolet Light Exposure." In 2013 International Image Sensor Workshop Program. 2013.

Kistner et al., "Photoluminescence from silicon nitride—no quantum effect." In J. Appl. Phys. 110, 023520. 2011.

\* cited by examiner

SYSTEMS AND METHODS FOR DETECTING ULTRAVIOLET LIGHT USING IMAGE SENSORS

BACKGROUND

This relates generally to imaging systems, and more particularly, to imaging systems with imaging devices having ultraviolet light detection capabilities.

Image sensors are commonly used in electronic devices such as cellular telephones, cameras, and computers to capture images. In a typical arrangement, an electronic device is provided with an array of image pixels arranged in pixel rows and pixel columns. The image pixels contain a layer of silicon that forms a photosensitive region for generating charge in response to image light. Circuitry is commonly coupled to each pixel column for reading out image signals from the image pixels.

Conventional imaging systems sample the visible light spectrum using red, green, and blue (RGB) image pixels arranged in a Bayer mosaic pattern. The photosensitive region in each of the image pixels generates an image signal in response to red, green, or blue light that is incident upon the pixel.

In some scenarios, it may be desirable to sample light outside of the visible light spectrum. For example, it may be useful to sample ultraviolet light in low-light environments or in applications such as machine vision, fracture mechanics, biology, automotive or other vehicular environment monitoring, space exploration, and spectrophotometry. However, the silicon used in the photosensitive regions of conventional imaging systems exhibits a low absorption of ultraviolet radiation, which can make it difficult to detect ultraviolet light using conventional image sensors. While the silicon used to form the photosensitive regions in conventional image sensors can be modified to increase ultraviolet absorptivity, doing so requires extensive changes to the structure and composition of the photodiode that may complicate manufacturing and increase production costs.

It would therefore be desirable to be able to provide imaging devices with improved ultraviolet light detection capabilities.

DETAILED DESCRIPTION

Electronic devices such as digital cameras, computers, cellular telephones, and other electronic devices include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements. Readout circuitry may include selectable readout circuitry coupled to each column of pixels that can be enabled or disabled to reduce power consumption in the device and improve pixel readout operations.

Figure 1:
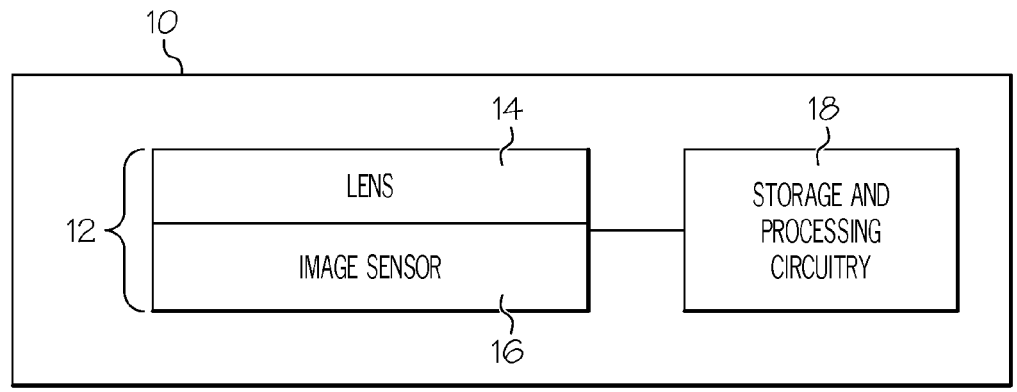
FIG. 1 is a diagram of an illustrative imaging system in accordance with an embodiment of the present invention.

FIG. 1 is a diagram of an illustrative imaging system that uses an image sensor to capture images. Imaging system 10 of FIG. 1 may be a portable electronic device such as a camera, a cellular telephone, a video camera, or other imaging device that captures digital image data. Imaging system 10 may include a camera module 12 that is used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18 (sometimes referred to herein as image processing circuitry 18 or processor 18). If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device such as display equipment) using wired and/or wireless communications paths coupled to processing circuitry 18.

Figure 2:
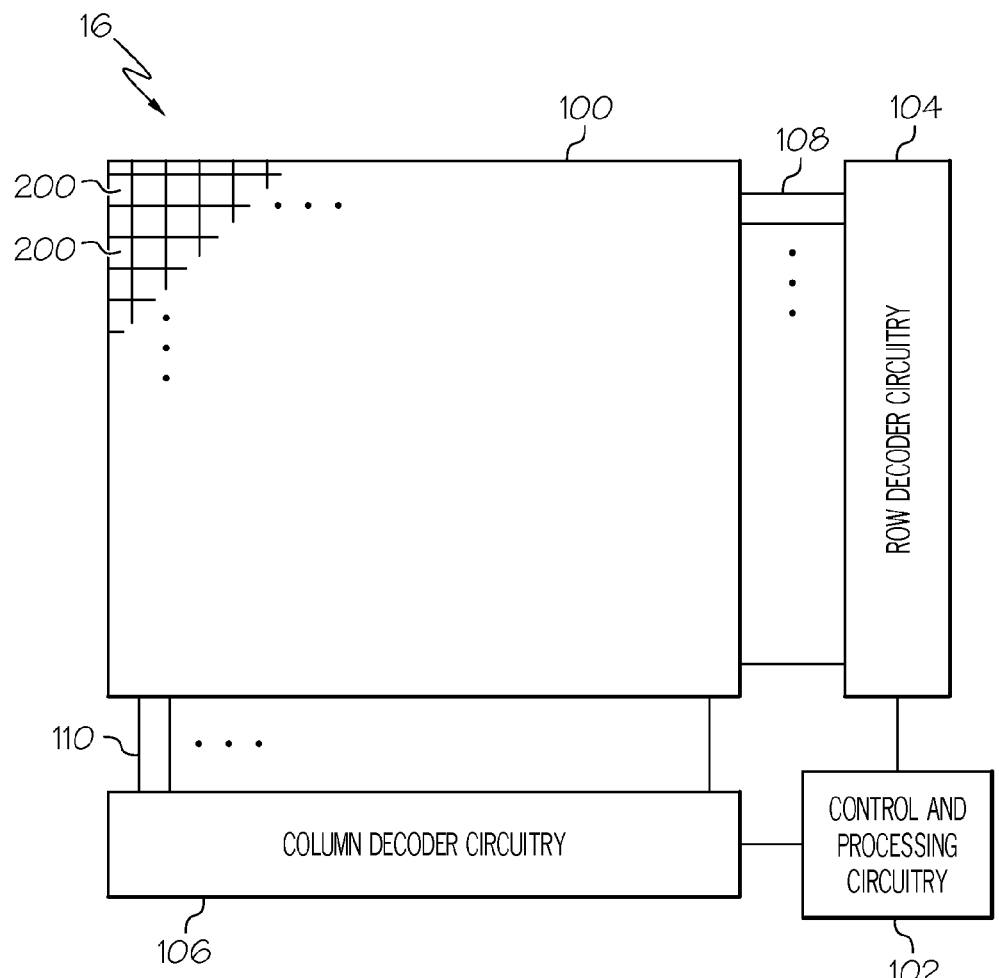
FIG. 2 is a diagram of an illustrative pixel array and associated control circuitry for reading out pixel data from image pixels along column lines in an image sensor in accordance with an embodiment of the present invention.

As shown in FIG. 2, image sensor 16 may include a pixel array 100 containing pixels 200 (sometimes referred to herein as image pixels 200 or image sensor pixels 200) and control and processing circuitry 102. Array 100 may contain, for example, hundreds or thousands of rows and columns of pixels 200. Control circuitry 102 may be coupled to row decoder circuitry 104 and column decoder circuitry 106. Row decoder circuitry 104 may receive row addresses from control circuitry 102 and supply corresponding row control signals such as reset, row-select, transfer, and read control signals to pixels 200 over control paths 108. One or more conductive lines such as column lines 110 may be coupled to each column of pixels 200 in array 100. Column lines 110 may be used for reading out image signals from pixels 200 and for supplying bias signals (e.g., bias currents or bias voltages) to pixels 200. During pixel readout operations, a pixel row in array 100 may be selected using row decoder circuitry 104 and image data associated with image pixels 200 in that pixel row can be read out along column lines 110.

Column decoder circuitry 106 may include sample-and-hold circuitry, amplifier circuitry, analog-to-digital conversion circuitry, bias circuitry, column memory, latch circuitry for selectively enabling or disabling the column circuitry, or other circuitry that is coupled to one or more columns of pixels in array 100 for operating pixels 200 and for reading out image signals from pixels 200. Column decoder circuitry 106 may be used to selectively provide power to column circuitry on a selected subset of column lines 110. Readout circuitry such as signal processing circuitry associated with column decoder circuitry 106 (e.g., sample-and-hold circuitry and analog-to-digital conversion circuitry) may be used to supply digital image data to processor 18 (as shown in FIG. 1, for example) for pixels in chosen pixel columns.

If desired, pixels 200 in array 100 of FIG. 2 may be provided with an array of color filter elements (e.g., an array of color filters 202) that each pass one or more colors of light. All or some of pixels 200 may be provided with a color filter element 202. Color filter elements for pixels 200 may be red color filter elements (e.g., photoresistive material that passes red light while reflecting and/or absorbing other colors of light), blue color filter elements (e.g., photoresistive material that passes blue light while reflecting and/or absorbing other colors of light), and/or green color filter elements (e.g., photoresistive material that passes green light while reflecting and/or absorbing other colors of light). Color filter elements 202 may also be configured to filter light that is outside the visible human spectrum. For example, color filter elements 202 may be configured to filter ultraviolet or infrared light (e.g., color filter element 202 may only allow infrared light or ultraviolet light to pass). Color filter elements may configure image pixel 200 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

Figure 3:
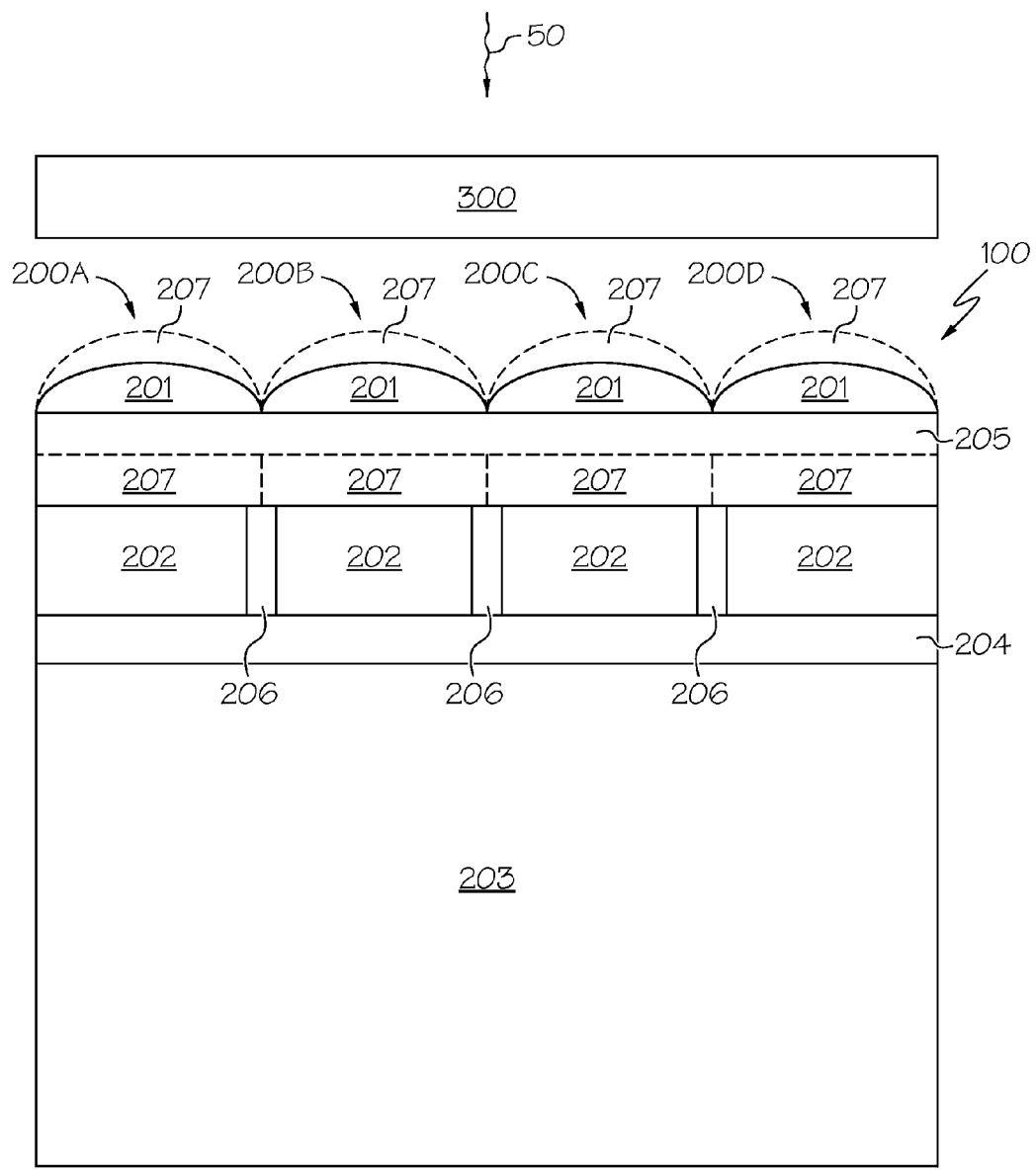
FIG. 3 is a cross-sectional side view of a portion of an illustrative pixel array of the type shown in FIG. 2 that may include a photoluminescent layer for detecting ultraviolet light in accordance with an embodiment of the present invention.

A cross-sectional side view of an illustrative group of image sensor pixels 200 that may be formed in pixel array 100 is shown in FIG. 3. As shown in FIG. 3, image sensor pixels 200 may include four adjacent image sensor pixels (e.g., a first pixel 200A, a second pixel 200B, a third pixel 200C, and a fourth pixel 200D). Each image pixel 200 may be provided with a corresponding lens 201 such as a microlens, a corresponding color filter such as color filter 202 (sometimes referred to herein as color filter element 202 or color filter layer 202), and a layer of photosensitive material such as a layer of epitaxial silicon 203 (sometimes referred to herein as a silicon wafer 203, wafer 203, photosensitive layer 203, or photosensitive region 203). Silicon layer 203 may form the photosensitive portion of one or more photodiodes in pixel array 100. For example, each of pixels 200A-D may be provided with a corresponding photodiode having a photosensitive region formed in silicon layer 203. If desired, each pixel in pixel array 100 may be provided with one or more photodiodes formed from silicon layer 203.

Microlens 201 may be formed over an upper surface of color filter element 202 to direct incoming light such as image light 50 (sometimes referred to herein as light 50, incoming light 50, incident light 50, or photons 50) through color filter 202 so that only light of a color (i.e., a wavelength or range of wavelengths) corresponding to color filter 202 (based on, for example, the light transmission characteristics of color filter 202) is received at silicon layer 203. If desired, the color filter elements 202 may optionally be formed within color filter housing structures 206 (sometimes referred to collectively as color filter array in a box or "CIAB" structures). This, however, is merely illustrative. If desired, housing structures 206 may be omitted from all or a portion of pixel array 100.

Pixel array 100 may be provided with a passivation layer 204 interposed between silicon layer 203 and one or more of the other layers in pixel array 100. In the illustrative example of FIG. 3, passivation layer 204 is interposed between epitaxial silicon 203 and color filter elements 202. If desired, passivation layer 204 may be formed form a high-K dielectric material such as HfO or TaO and an oxide layer. This, however, is merely illustrative. In general, passivation layer 204 may be formed of any suitable dielectric or other material.

If desired, pixel array 100 may be provided with a planar layer 205 (sometimes referred to herein as a planarization layer 205). Planarization layer 205 may be formed over color filter array 202 to provide a planar surface on which microlenses 201 may be formed.

If desired, image sensor 16 may be provided with a filter 300 formed over pixel array 100. Filter 300 may be configured to pass and/or block a given wavelength or range of wavelengths of light. In the illustrative example of FIG. 2, filter 300 may be a visible cut filter that blocks light having a visible wavelength (e.g., light having a wavelength or range of wavelengths greater than or equal to about 400 nm and less than or equal to about 700 nm) while allowing light having a wavelength in the ultraviolet portion of the electromagnetic spectrum (e.g., light having a wavelength or range of wavelengths greater than or equal to about 100 nm and less than or equal to about 400 nm) to pass. In this way, filter 300 may also be referred to as a UV pass filter. In some exemplary arrangements, filter 300 may be configured to block and/or pass light in the visible spectrum. For example, filter 300 may be configured to block any suitable combination of red, green, and blue light (filter 300 may be a red, green, or blue cut filter, filter 300 may be a red, green or blue pass filter, etc.). If desired, filter 300 may be configured to pass and/or block combinations of light having wavelengths in the visible portion of the spectrum and outside of the visible portion of the spectrum.

In one suitable arrangement that is sometimes described herein as an example, pixel array 100 may be provided with a layer of photoluminescent (PL) material 207 (sometimes referred to herein as light-emitting layer 207, wavelength shifting layer 207, or emissive layer 207). Photoluminescent layer 207 may be formed of a material that emits light in response to absorbing photons. In one suitable example, photoluminescent material 207 may be a layer of silicon nitride ($SiN_x$). Silicon nitride layer 207 may be formed using a vapor deposition process in which a mixture of silane ($SiH_4$) and ammonia ($NH_3$) are used to deposit a layer of silicon nitride on one or more surfaces of pixel array 100. This, however, is merely illustrative. If desired, photoluminescent layer 207 may be formed from any suitable photoluminescent material.

When light (e.g. photons 50) are absorbed by photoluminescent layer 207, electrons in the photoluminescent material may be excited to a higher energy state (level) while remaining bound to a respective atom in the photoluminescent material (e.g., assuming that the energy of the absorbed photon is not large enough to cause photoionization). After excitation, the electrons may undergo relaxation processes to lower energy states during which other photons (light) are re-radiated (emitted). The light emitted by the photoluminescent material may have a different wavelength than the light that is absorbed by the photoluminescent material. For example, photoluminescent layer 207 may be configured to absorb light having a range of wavelengths corresponding to an ultraviolet region of the electromagnetic spectrum and may emit light having a range of wavelengths corresponding to the visible region of the electromagnetic spectrum. In other words, photoluminescent layer 207 may absorb ultraviolet light and emit visible light. In this way, photoluminescent layer 207 may be used to absorb ultraviolet light from a given image scene and generate corresponding visible light that may then be received at silicon layer 203 to generate an "ultraviolet" image signal indicative of the ultraviolet radiation. In this way, silicon layer 203 may generate image signals in response to incoming ultraviolet light despite the low ultraviolet absorption characteristics of silicon layer 203 (e.g., because the incoming ultraviolet light is converted or wavelength-shifted in layer 207 to visible light that is easily absorbed by layer 203).

The absorption and emission characteristics of photoluminescent material 207 may be tuned such that photoluminescent layer 207 absorbs light of a specific wavelength or range of wavelengths and emits light of a specific wavelength or range of wavelengths (e.g., that is different from the absorbed range of wavelengths). For example, photoluminescent material 207 may be adjusted or otherwise modified such that photoluminescent material 207 is configured to produce maximum visible photoluminescent emissions (e.g., have a maximum photoluminescence intensity) in response to a given wavelength of ultraviolet radiation. In one suitable example, photoluminescent material 207 may be tuned to emit light of a first visible wavelength in response to absorbing light of a first ultraviolet wavelength, may be tuned to emit light of a second visible wavelength in response to absorbing light of a second ultraviolet wavelength, and may be tuned to emit light of a third visible wavelength in response to absorbing light of a third ultraviolet wavelength.

If desired, the first, second, and third respective ultraviolet and visible wavelengths may each be different. For example, photoluminescent material 207 may be tuned to emit blue light in response to the first ultraviolet wavelength, may be tuned to emit green light in response to the second ultraviolet wavelength, and may be tuned to emit red light in response to the third ultraviolet wavelength. In such an arrangement, the first ultraviolet wavelength may have a first energy level, the second ultraviolet wavelength may have an energy level that is greater than the first energy level, and the third ultraviolet wavelength may have an energy level that is greater than the first and second energy levels. In other words, lower energy ultraviolet radiation may cause photoluminescent layer 207 to emit lower energy visible radiation, and higher energy ultraviolet radiation may cause photoluminescent layer 207 to emit higher energy visible radiation. In one suitable example, photoluminescent layer 207 may be configured to absorb ultraviolet radiation and emit infrared radiation.

Tuning of photoluminescent layer 207 to exhibit peak photoluminescence emissions of a desired wavelength or range of wavelengths may be achieved by adjusting the relative amounts of silane and ammonia that are used in the deposition process that may be used to form photoluminescent layer 207. Photoluminescent layers 207 that are formed using different $SiH_4/NH_3$ ratios may demonstrate different photoluminescent emission characteristics in response to different wavelengths of incident light.

Pixel array 100 may be provided with one or more light-emitting layers 207. As shown in the illustrative example of FIG. 3, light-emitting layer 207 may be formed on pixel array 100 over microlenses 201 (e.g., light-emitting layer 207 may form the outermost layer of pixel array 100). In such an arrangement, light-emitting layer 207 may absorb light that is incident upon pixel array 100 and may emit light (e.g., visible light) through microlenses 201 and color filters 202 such that the emitted light is absorbed at silicon layer 203. In the illustrative example of FIG. 3, filter 300 may be a UV pass/visible cut filter. In such an arrangement, pixel array 100 may receive only ultraviolet light from the scene or environment that is captured using image sensor 16. In this way, the only visible light that is absorbed by silicon layer 203 for pixels 200A-D may be generated by light-emitting layer 207.

In another suitable example, light-emitting layer 207 may be formed between microlenses 201 and silicon layer 203. As shown in FIG. 3, for example, light-emitting layer 207 may be formed between color filter layer 202 and planarization layer 205. In another suitable arrangement, light-emitting layer 207 may be formed (interposed) between planarization layer 205 and microlenses 201. In configurations in which light-emitting layer 207 is formed beneath microlenses 201 (i.e., light-emitting layer 207 is not the outermost layer of pixel array 100), ultraviolet radiation may be incident upon microlenses 201. In such a configuration, it may be desirable to form microlenses 201 of a material that does not absorb ultraviolet light and that does not degrade in the presence of ultraviolet radiation. For example, microlenses 201 may be formed from a dielectric material that is capable of focusing ultraviolet light. In arrangements in which microlenses 201 are not the outermost layer of pixel array 100 (e.g., when light-emitting layer 207 is formed over microlenses 201), microlenses 201 may be formed from any suitable material. For example, microlenses 201 may be polymer lenses.

In one suitable arrangement, a single light-emitting layer 207 may be formed on pixel array 100 (e.g., such that a single layer 207 covers all of pixels 200). In such an arrangement, the light-emitting layer 207 may be configured to absorb a range of ultraviolet wavelengths and to emit a range of visible wavelengths (e.g., light-emitting layer 207 may not be tuned to produce peak emissions at particular visible wavelengths or to have a peak response to a certain range of ultraviolet wavelengths). In such an arrangement, light-emitting layer 207 may emit light of the same range of wavelengths onto each pixel 200 in pixel array 100. The light emitted by light-emitting layer 207 may be filtered by color filters 202 such that the region of silicon 203 corresponding to each respective pixel 200 only receives light of a given color. In other words, each pixel 200 may receive light of the same or a similar visible color or mix of colors from light-emitting layer 207, and the color filters 202 formed over each pixel 200 may filter the light from light-emitting layer 207 such that silicon 203 receives the appropriate color of light for which the given pixel is configured to detect.

If desired, some or all of light-emitting layer 207 may be tuned or adjusted to generate photoluminescent emissions of a given wavelength over particular corresponding pixels 200 in pixel array 100. In the illustrative example of FIG. 3, pixels 200A and 200C may be provided with green color filters 202 and may generate image signals in response to green light whereas pixels 200B and 200D may be provided with red color filters 202 and may generate image signals in response to red light. In such a configuration, pixels 200A and 200C may be provided with a light-emitting layer 207 that is tuned to generate photoluminescent emissions having a peak range of wavelengths corresponding to green visible light whereas pixels 200B and 200D may be provided with a light-emitting layer 207 that is tuned to generate photoluminescent emissions having a peak range of wavelengths corresponding to red visible light. By tuning light-emitting layer 207, a given pixel (or pixels) 200 in pixel array 100 may receive peak emission intensities at wavelengths corresponding to the color of light that the given pixel is configured to detect.

Figure 4:
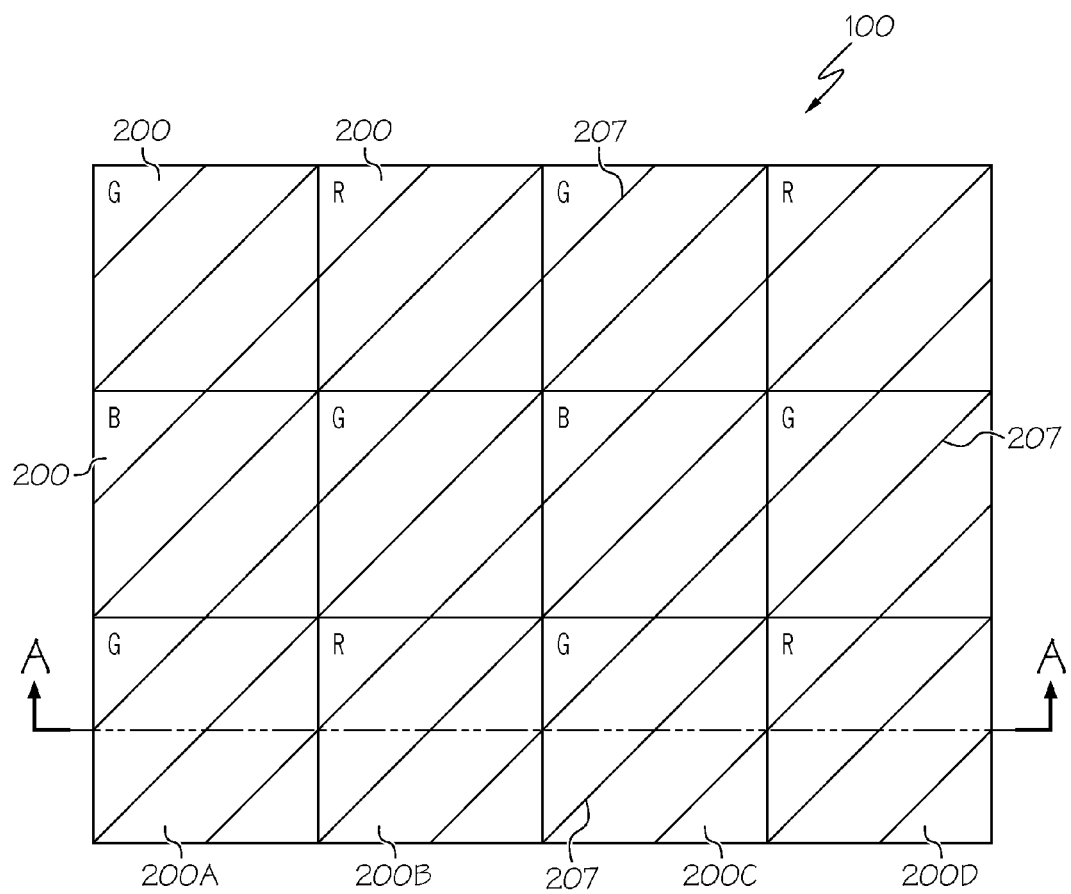
FIG. 4 is a top-down view of a portion of an illustrative pixel array of the type shown in FIG. 2 that may include a photoluminescent layer for detecting ultraviolet light in accordance with an embodiment of the present invention.

An illustrative top view of a portion of pixel array 100 is shown in FIG. 4 (e.g., FIG. 3 represents a cross-sectional view of pixel array 100 taken along line A-A in FIG. 4). As shown in FIG. 4, pixels 200 in pixel array 100 are provided with a color filter array (formed of color filters 202, for example) which allows a single image sensor to sample red, green, and blue (RGB) light using corresponding red (R), green (G), and blue (B) image sensor pixels arranged in a Bayer mosaic pattern. The Bayer mosaic pattern consists of a repeating unit cell of two-by-two image pixels, with two green image pixels diagonally opposite one another (i.e., two diagonally opposed green pixels) and adjacent to a red image pixel diagonally opposite to a blue image pixel (i.e., diagonally opposed red and blue pixels). However, limitations of signal to noise ratio (SNR) that are associated with the Bayer mosaic pattern make it difficult to reduce the size of image sensors such as image sensor 16.

In one suitable scenario that is sometimes discussed herein as an example, the green pixels in a Bayer pattern are replaced by clear image pixels. A unit cell of image pixels 200 may be formed from two clear image pixels (sometimes referred to herein as clear (C) image pixels) that are diagonally opposite one another (i.e., two diagonally opposed clear pixels) and adjacent to a red (R) image pixel that is diagonally opposite to a blue (B) image pixel. Clear image pixels 200 in the unit cell may be formed with a visibly transparent color filter that transmits light across the visible light spectrum (e.g., clear pixels 200 can capture white light). Clear image pixels 200 may have a natural sensitivity defined by the material that forms the transparent color filter and/or the material that forms the image sensor pixel (e.g., silicon). The sensitivity of clear image pixels 200 may, if desired, be adjusted for better color reproduction and/or noise characteristics through use of light absorbers such as pigments. A unit cell may be repeated across image pixel array 100 to form a mosaic of red, clear, and blue image pixels 200. In this way, red image pixels may generate red image signals in response to red light, blue image pixels may generate blue image signals in response to blue light, and clear image pixels may generate white image signals in response to white light. The white image signals may also be generated by the clear image pixels in response to any suitable combination of red, blue, and/or green light. This, however, is merely illustrative. If desired, any color image pixels may be formed adjacent to the diagonally opposing clear image pixels in a unit cell. For example, a unit cell may be defined by two clear image pixels 210 that are formed diagonally opposite one another and adjacent to a red image pixel that is diagonally opposite to a green (G) image pixel (i.e., diagonally opposed red and green pixels). In yet another suitable arrangement, a unit cell may be defined by two clear image pixels 200 that are formed diagonally opposite one another and adjacent to a blue image pixel that is diagonally opposite to a green image pixel (i.e., diagonally opposed blue and green pixels).

Clear image pixels C can help increase the signal-to-noise ratio (SNR) of image signals captured by image pixels 210 by gathering additional light in comparison with image pixels having a narrower color filter (e.g., a filter that transmits light over a subset of the visible light spectrum), such as green image pixels. Clear image pixels C may particularly improve SNR in low light conditions in which the SNR can sometimes limit the image quality of images. Image signals gathered from image pixel array 100 having clear image pixels may be converted to red, green, and blue image signals to be compatible with circuitry and software that is used to drive most image displays (e.g., display screens, monitors, etc.). This conversion generally involves the modification of captured image signals using a color correction matrix (CCM). Color correction operations (using a CCM, for example) may be performed on the white image signals generated by clear image pixels to extract a green image signal.

As shown in FIG. 4, light-emitting layer 207 (indicated by diagonal lines on pixels 200) may be formed over all of the pixels 200 in pixel array 100. This, however, is merely illustrative. If desired, light-emitting layer 207 may be selectively formed over only some of pixels 200 in pixel array 100 (i.e., light-emitting layer 207 may be patterned over array 100). As described above in connection with FIG. 3, light-emitting layer 207 may be configured to generate similar emissions at each pixel 200, or may be modified to produce emissions having peak intensities at wavelengths corresponding to specific color filters 202 in pixel array 100. For example, portions of light-emitting layer 207 formed over blue pixels B may be tuned to exhibit a peak emission corresponding to blue wavelengths, portions of light-emitting layer 207 formed over green pixels G may be tuned to exhibit a peak emission corresponding to green wavelengths, and portions of light-emitting layer 207 formed over red pixels R may be tuned to exhibit a peak emission corresponding to red wavelengths.

Figure 5:
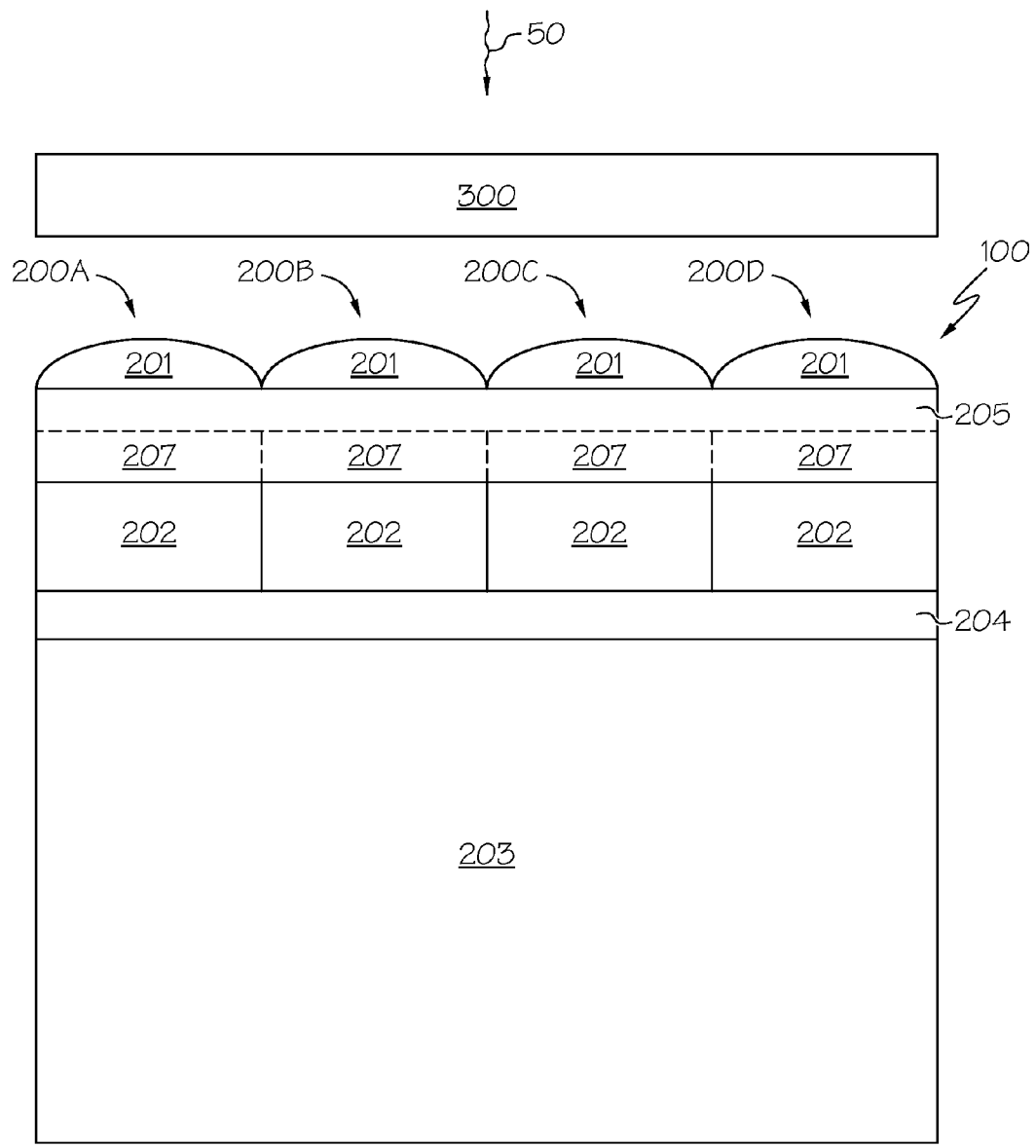
FIG. 5 is a cross-sectional side view of a portion of an illustrative pixel array of the type shown in FIG. 2 that may include a patterned photoluminescent layer for detecting ultraviolet light in accordance with an embodiment of the present invention.

A cross-sectional side view of image pixels 200 that may be formed as part of pixel array 100 is shown in FIG. 5. As described above in connection with FIG. 3, pixel array 100 may be provided with microlenses 201, color filters 202, silicon layer 203, passivation layer 204, planarization layer 205, and photoluminescent layer 207. Image sensor 16 may include a filter 300 that transmits light of a selected wavelength or range of wavelengths to pixel array 100. In the illustrative example of FIG. 5, filter 300 may be configured to pass and/or absorb a combination of visible and ultraviolet wavelengths. For example, filter 300 may be a UV pass/visible pass filter that transmits both ultraviolet and visible light. If desired, filter 300 may be a UV pass/green cut filter that transmits ultraviolet, red, and blue light, and blocks green light. This, however, is merely illustrative. Filter 300 may be a UV pass/red cut filter, a UV pass/blue cut filter, or may be configured to pass UV light and only transmit visible light corresponding to one range of wavelengths (e.g., a UV pass/green pass filter, a UV pass/blue pass filter, a UV pass/red pass filter, etc.). In general, filter 300 may be configured to block and/or pass any combination of wavelengths in the infrared, visible, and ultraviolet regions of the electromagnetic spectrum.

Figure 6A:
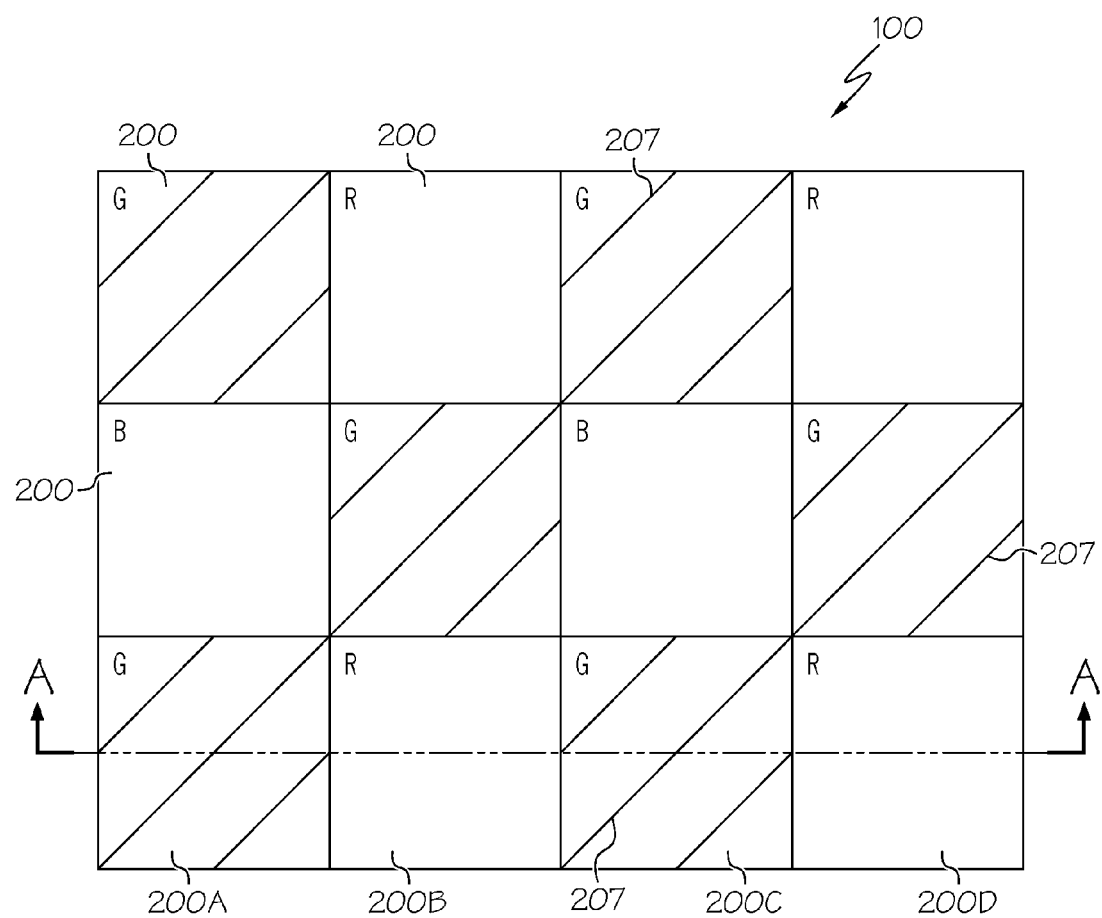
FIGS. 6A-6E are top-down views of a portion of an illustrative pixel array of the type shown in FIG. 2 that may include a patterned photoluminescent layer for detecting ultraviolet light in accordance with an embodiment of the present invention.

If desired, light-emitting layer 207 may be a patterned light-emitting layer that is formed over some pixels 200 without covering other pixels 200. An example of such an arrangement is shown in FIG. 6A, which shows how light-emitting layer 207 may be formed only over pixels 200 that are configured to generate image signals in response to green light (i.e., pixels 200 that are provided with green color filters) and without being formed over pixels 200 that are configured to generate image signals in response to red light (i.e., pixels 200 that are provided with red color filters) or over pixels 200 that are configured to generate image signals in response to blue light (i.e., pixels 200 that are provided with blue color filters). In such an arrangement, light-emitting layer 207 may be absent from pixels 200B and 200D in the cross-sectional view taken along line A-A of FIG. 6A that is shown in FIG. 5. If desired, filter 300 may be a UV pass/green cut filter. In this way, red pixels R and blue pixels B (i.e., pixels that do not include light-emitting layer 207) may receive red and blue light from the environment through filter 300 and may generate image signals in response to the environmental light. Filter 300 may block green light from the environment from reaching pixel array 100. In this way, the only green light received at green pixels G may be green light that is emitted by light-emitting layer 207 in response to absorbing the ultraviolet light that is transmitted through filter 300. If desired, light-emitting layer 207 may be tuned such that the peak photoluminescence emissions of the emissive material have wavelengths corresponding to visible green light (in response to a given wavelength of ultraviolet light, for example). An image pixel array 100 having the configuration shown in FIG. 6A may be configured to generate images in which red and blue light in a captured scene are shown as red and blue portions of the image, and in which ultraviolet light in the scene is shown by green portions of the image. Because the green light received by the pixel array 100 is emitted by light-emitting layer 207, the green portions of the image may be considered "false" colored (i.e., the green portions of the image do not represent green light in the captured scene). In this way, green light in a captured scene may not be received at pixel array 100 and may not be represented in the captured image.

Figure 6B:
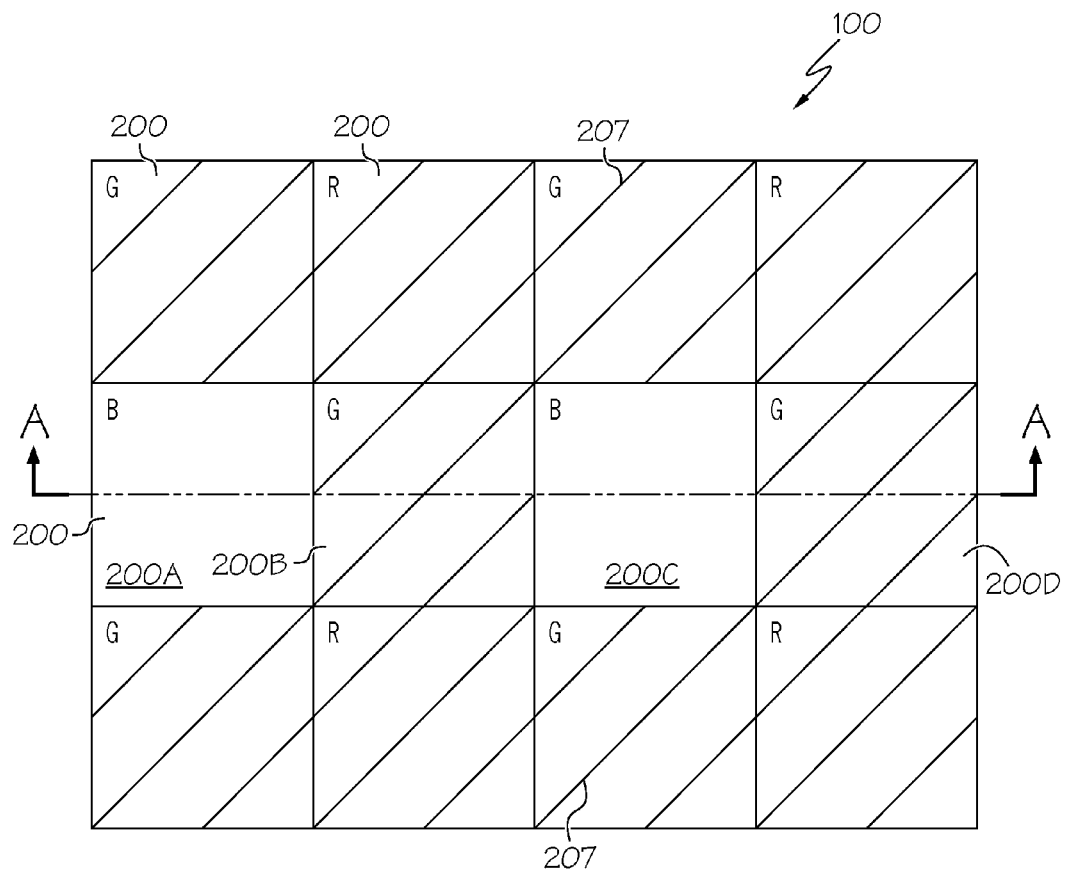

As shown in the illustrative example of FIG. 6B, light-emitting layer 207 may be formed only over pixels 200 that are configured to generate image signals in response to green light (i.e., pixels 200 that are provided with green color filters) and pixels 200 that are configured to generate image signals in response to red light (i.e., pixels 200 that are provided with red color filters) and without being formed over pixels 200 that are configured to generate image signals in response to blue light (i.e., pixels 200 that are provided with blue color filters). In such an arrangement, light-emitting layer 207 may be absent over blue pixels 200A and 200C in the cross-sectional view taken along line A-A of FIG. 6B that is shown in FIG. 5. If desired, filter 300 may be a UV pass/blue pass filter. In this way, blue pixels B (i.e., pixels that do not include light-emitting layer 207) may receive blue light through from the environment through filter 300 and generate image signals in response to this environmental light. Filter 300 may block green light and red light from the environment from reaching pixel array 100. In this way, the only green light and red light received at green pixels G and red pixels R, respectively, may be green light and red light that is emitted by light-emitting layer 207 in response to absorbing the ultraviolet light that is transmitted through filter 300. If desired, light-emitting layer 207 may be tuned such that the peak photoluminescence emissions of the emissive material have wavelengths corresponding to visible green light and red light (in response to given wavelengths of ultraviolet light, for example). For example, portions of light-emitting layer 207 formed over red pixels R may be tuned to have peak photoluminescence emissions having wavelengths corresponding to visible red light, and portions of light-emitting layer 207 formed over red pixels G may be tuned to have peak photoluminescence emissions having wavelengths corresponding to visible green light. An image pixel array 100 having the configuration shown in FIG. 6B may be configured to generate images in which blue light in a captured scene is shown by blue portions of the image, and in which ultraviolet light in the scene is shown as green portions and red portions of the image. Because the red light and green light received by the pixel array 100 is emitted by light-emitting layer 207, the red and green portions of the image may be considered "false" (i.e., the red and green portions of the image do not represent red and green light in the captured scene). In this way, red and green light in a captured scene may not be received at pixel array 100 and may not be represented in the captured image. By tuning the portions of light-emitting layer 207 formed over red pixels R and green pixels G to photoluminesce in response to different wavelengths of ultraviolet light, different wavelengths of ultraviolet light present in a captured scene may be represented by different "false" colors in the captured image.

Figure 6C:
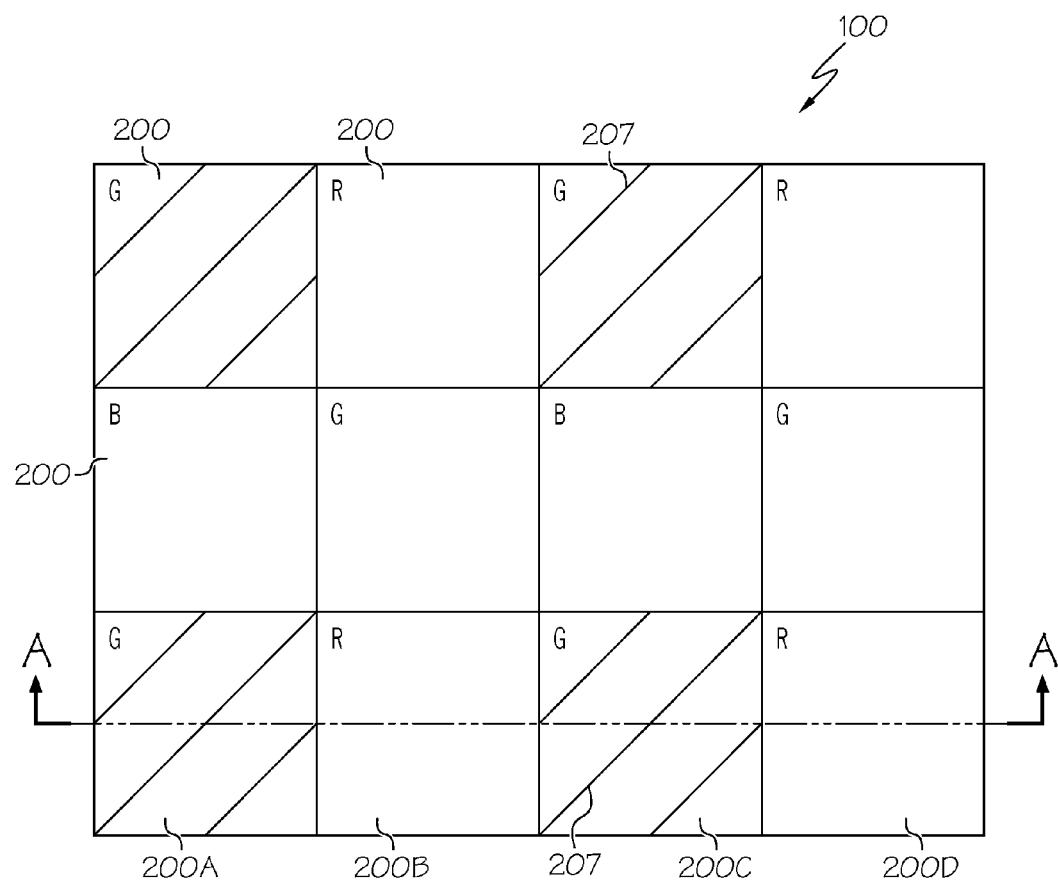

As shown in FIG. 6C, light-emitting layer 207 may be selectively formed over some but not all of pixels 200 that are configured to generate image signals in response to green light (i.e., pixels 200 that are provided with green color filters) without being formed over pixels 200 that are configured to generate image signals in response to red light (i.e., pixels 200 that are provided with red color filters) or over pixels 200 that are configured to generate image signals in response to blue light (i.e., pixels 200 that are provided with blue color filters). In such an arrangement, light-emitting layer 207 may be present over green pixels 200A and 200C and may be absent over red pixels 200B and 200D in the cross-sectional view taken along line A-A of FIG. 6C that is shown in FIG. 5. A cross-sectional view taken through the green and blue pixels shown in FIG. 6C would reveal that light-emitting layer 207 may be absent over at least some the green pixels and/or blue pixels. If desired, filter 300 may be a UV pass/visible pass filter. In this way, red pixels R, blue pixels B, and green pixels G over which light-emissive layer 207 is not formed (i.e., pixels that do not include light-emitting layer 207) may receive red, blue light, and green light through from the environment through filter 300 and generate image signals in response to this environmental light. At green image pixels G that do include light-emitting layer 207, both green light present in the captured scene and green light that is emitted by light-emitting layer 207 in response to absorbing the ultraviolet light that is transmitted through filter 300 may be received. If desired, light-emitting layer 207 may be tuned such that the peak photoluminescence emissions of the emissive material have wavelengths corresponding to visible green light (in response to a given wavelength of ultraviolet light, for example). An image pixel array 100 having the configuration shown in FIG. 6C may be configured to generate images in which red light, blue light, and green light in a captured scene are shown as red, blue, and green portions of the image, and in which ultraviolet light in the scene is also shown by green portions of the image. Because some of the green light received by the pixel array 100 is emitted by light-emitting layer 207, some green portions of the image may be considered "false" colored (i.e., the green portions of the image do not represent green light in the captured scene).

Figure 6D:
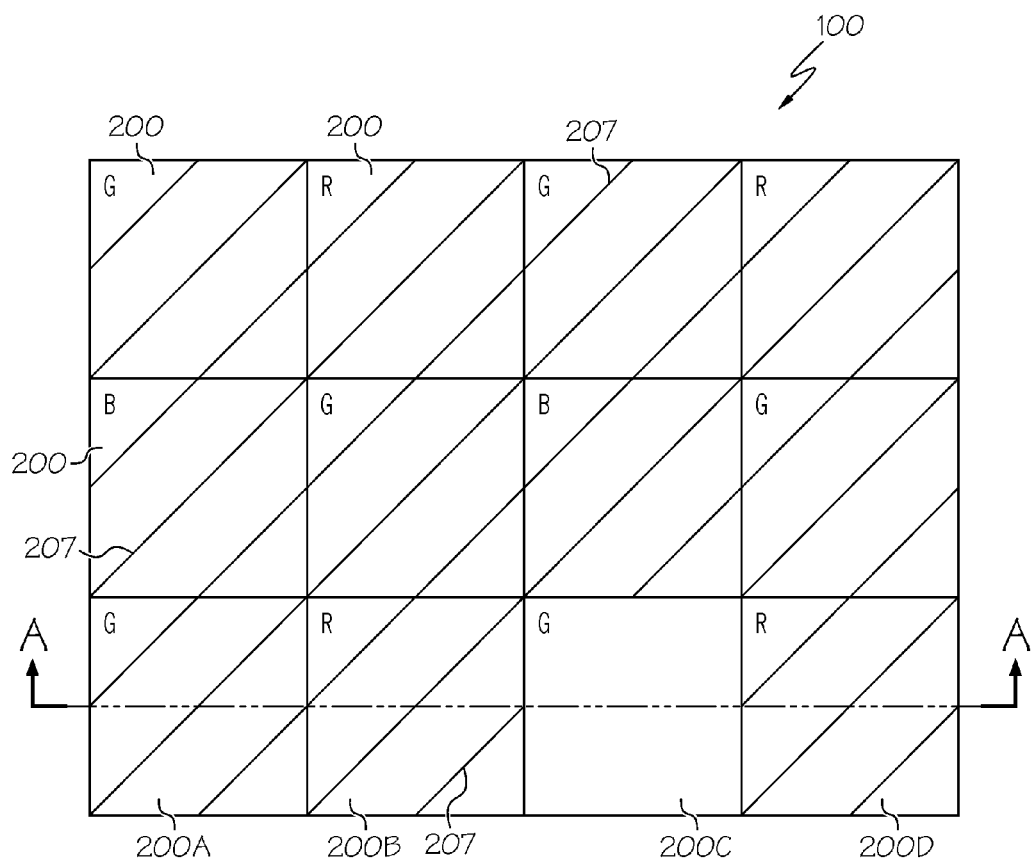

As shown in the illustrative example of FIG. 6D, light-emitting layer 207 may be formed over pixels 200 that are configured to generate image signals in response to red light (i.e., pixels 200 that are provided with red color filters) and pixels 200 that are configured to generate image signals in response to blue light (i.e., pixels 200 that are provided with blue color filters), and may be selectively formed over some but not all of pixels 200 that are configured to generate image signals in response to green light (i.e., pixels 200 that are provided with green color filters). In such an arrangement, light-emitting layer 207 may be present over green pixel 200A and red pixels 200B and 200D, and may be absent over green pixel 200C in the cross-sectional view taken along line A-A of FIG. 6D that is shown in FIG. 5. If desired, filter 300 may be a UV pass/visible pass filter. In this way, green pixels G over which light-emissive layer 207 is not formed (i.e., pixels that do not include light-emitting layer 207) may receive green light from the environment through filter 300 and generate image signals in response to this environmental light. At green image pixels G, red image pixels R, and blue image pixels B that do include light-emitting layer 207, both green light, red light, and blue light present in the captured scene and green light, red light, and blue light that is emitted by light-emitting layer 207 in response to absorbing the ultraviolet light that is transmitted through filter 300 may be received. If desired, portions of light-emitting layer 207 formed over green pixels G may be tuned such that the peak photoluminescence emissions of the emissive material have wavelengths corresponding to visible green light (in response to a given wavelength of ultraviolet light, for example), portions of light-emitting layer 207 formed over red pixels R may be tuned such that the peak photoluminescence emissions of the emissive material have wavelengths corresponding to visible red light (in response to a given wavelength of ultraviolet light, for example), and portions of light-emitting layer 207 formed over blue pixels B may be tuned such that the peak photoluminescence emissions of the emissive material have wavelengths corresponding to visible blue light (in response to a given wavelength of ultraviolet light, for example). If desired, the given wavelengths to which light-emitting layer 207 is configured to generate emissions having a peak intensity may be different for the red, green, and blue pixels, respectively. An image pixel array 100 having the configuration shown in FIG. 6D may be configured to generate images in which red light, blue light, and green light in a captured scene are shown as red, blue, and green portions of the image, and in which ultraviolet light in the scene is also shown as red, green, and blue portions of the image. Because some of the red, blue, and green light received by the pixel array 100 is emitted by light-emitting layer 207, these red, blue, and green portions of the image may be considered "false" colored (i.e., the red, blue, and green portions of the image do not represent red, blue, and green light in the captured scene).

Figure 6E:
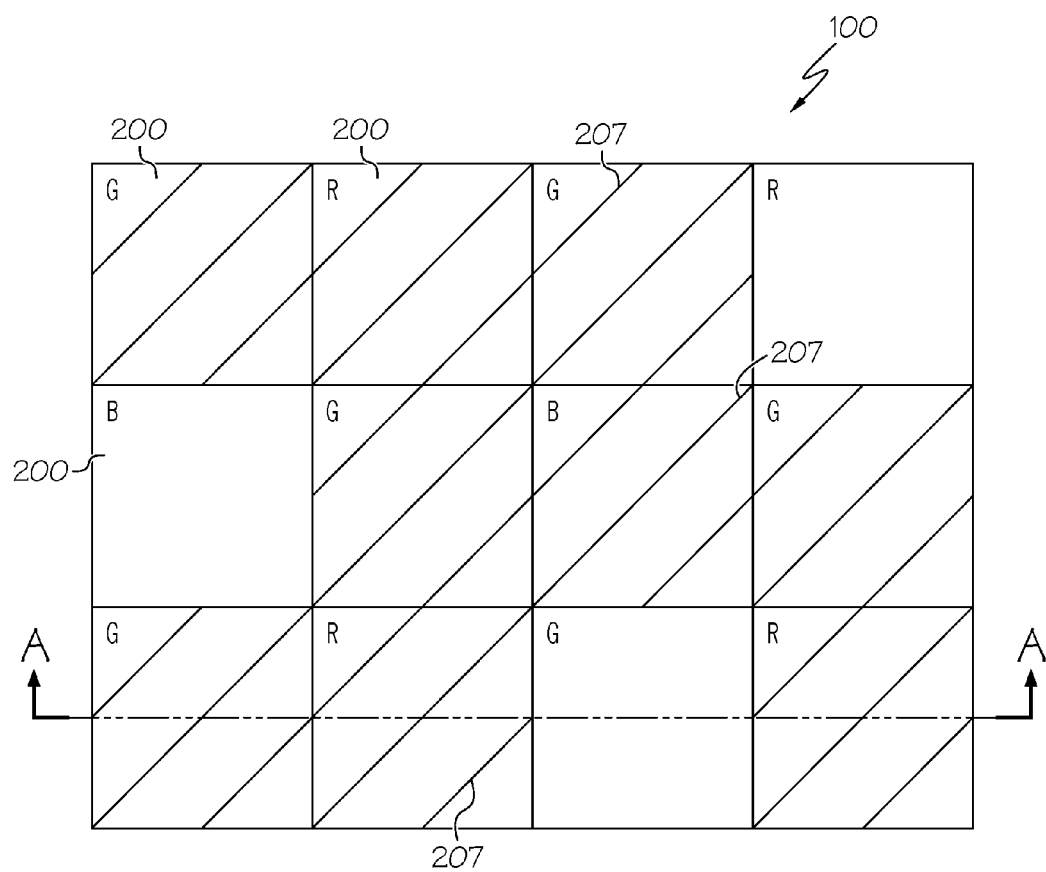

As shown in the illustrative example of FIG. 6E, light-emitting layer 207 may be selectively formed over some but not all pixels 200 that are configured to generate image signals in response to red light (i.e., pixels 200 that are provided with red color filters), some but not all of pixels 200 that are configured to generate image signals in response to blue light (i.e., pixels 200 that are provided with blue color filters), and some but not all of pixels 200 that are configured to generate image signals in response to green light (i.e., pixels 200 that are provided with green color filters). In such an arrangement, light-emitting layer 207 may be present over green pixel 200A and red pixels 200B and 200D, and may be absent over green pixel 200C in the cross-sectional view taken along line A-A of FIG. 6E that is shown in FIG. 5. A cross-sectional view taken through the red, green, and blue pixels shown in FIG. 6E would reveal that light-emitting layer 207 may be absent over at least some the red pixels, green pixels, and/or blue pixels. In this configuration, filter 300 may be a UV pass/visible pass filter. In this way green pixels G, red pixels R, and blue pixels B over which light-emissive layer 207 is not formed (i.e., pixels that do not include light-emitting layer 207) may receive red light, green light, and blue light from the environment through filter 300 and generate image signals in response to this environmental light. At green image pixels G, red image pixels R, and blue image pixels B that do include light-emitting layer 207, both green light, red light, and blue light present in the captured scene and green light, red light, and blue light that is emitted by light-emitting layer 207 in response to absorbing the ultraviolet light that is transmitted through filter 300 may be received. If desired, portions of light-emitting layer 207 formed over green pixels G may be tuned such that the peak photoluminescence emissions of the emissive material have wavelengths corresponding to visible green light (in response to a given wavelength of ultraviolet light, for example), portions of light-emitting layer 207 formed over red pixels R may be tuned such that the peak photoluminescence emissions of the emissive material have wavelengths corresponding to visible red light (in response to a given wavelength of ultraviolet light, for example), and portions of light-emitting layer 207 formed over blue pixels B may be tuned such that the peak photoluminescence emissions of the emissive material have wavelengths corresponding to visible blue light (in response to a given wavelength of ultraviolet light, for example). If desired, the given wavelengths to which light-emitting layer 207 is configured to generate emissions having a peak intensity may be different for the red, green, and blue pixels, respectively. An image pixel array 100 having the configuration shown in FIG. 6D may be configured to generate images in which red light, blue light, and green light in a captured scene are shown as red, blue, and green portions of the image, and in which ultraviolet light in the scene is also shown as red, green and blue portions of the image. Because some of the red, blue, and green light received by the pixel array 100 is emitted by light-emitting layer 207, these red, blue, and green portions of the image may be considered "false" colored (i.e., the red, blue, and green portions of the image do not represent green light in the captured scene).

In the arrangements described above in connection with FIGS. 6A-6E, some pixels of a given color (i.e., red green, and/or blue) in the pixel array may include emissive layer 207, while other pixels of the given color in the array may not include the given color. Because the pixels of the given color (e.g., green) that detect ultraviolet light also receive and detect visible green light in the captured scene, it may be desirable to filter the signals from these pixels to separate the portion of the signal generated in response to the ultraviolet light from the portion of the signal generated in response to the visible green light in the captured scene. This may be achieved by using the signals generated by the green pixels that only receive green light from the environment (i.e., the green pixels that do not include light-emitting layer 207) to determine the amount of the signal generated in response to the environmental light, and subtracting this amount from the combined environmental and ultraviolet light signal (i.e., the false green signal) generated by the green pixels that generate signals in response to the green light in the captured scene and the green light emitted by the light-emitting layer 207 in response to ultraviolet light in the captured scene.

In bright conditions, the signal generated by pixels that receive both environmental light and light emitted by the layer of emissive material may be dominated by the environmental light component, while the component generated in response to the light emitted by the photoluminescent layer may be comparatively small. In such a scenario, it may be difficult to extract the component of the signal representative of the ultraviolet light received at the pixel array 100 from the overall signal. In low-light conditions, however, the signal generated in response to the ultraviolet light may make a greater relative contribution to the overall signal generated by the pixels that receive both environmental light and light emitted by light-emitting layer 207. In such scenarios, the ultraviolet light signal may be extracted out and may provide details of the captured scene not otherwise detectable due to the low levels of visible light in the captured scene. Although the filtering process above has been described in connection with signals generated by green image pixels, this is merely illustrative. In general, a similar process can be used for signals generated by red pixels and blue image pixels in response to environmental light and light emitted by light-emitting layer 207.

If desired, light-emitting layer 207 may be formed over all or part of image pixel array 100. For example, a light-emitting layer 207 having any of the patterns show in FIGS. 6A-6E may be formed over all of the pixels in pixel array 100. If desired, the patterns shown in FIGS. 6A-6E may be combined in any suitable configuration to cover all or a portion of pixel array 100. In one suitable arrangement, light-emitting layer 207 may be formed over some but not all of the pixels 200 in pixel array 100. For example, light-emitting layer 207 may be formed only over certain clusters or groups of pixels 200 in pixel array 100, while light-emitting layer 207 may not be formed over other clusters or groups of pixels 200 in pixel array 100. If desired, at least a first group of pixels 200 in pixel array 100 may include a light-emitting layer 207 formed in first a pattern shown and described in connection FIGS. 6A-6E, and at least a second group of pixels 200 in pixel array 100 may include a light-emitting layer 207 formed in a second pattern shown and described in connection with FIGS. 6A-6E that is different from the first pattern. This, however, is merely illustrative. In general light-emitting layer 207 may be formed over any combination of pixels 200 in any suitable pattern or configuration over all or part of pixel array 100.

The examples described above in connection with FIGS. 6A-6E are merely illustrative. In general, pixel array 100 may include pixels 200 of a first color having color filter elements 202 that are configured to pass light of a first range of wavelengths (e.g., red light, green light, or blue light), may include pixels 200 of a second color having color filter elements 202 that are configured to pass light of a second range of wavelengths (e.g., red light, green light, or blue light) that is different than the first range of wavelengths, and may include pixels 200 of a third color having color filter elements 202 that are configured to pass light of a third range of wavelengths (e.g., red light, green light, or blue light) that is different than the first range of wavelengths and the second range of wavelengths. In some suitable scenarios, pixel array 100 may include pixels 200 of each of the first, second, and third colors (i.e., red, green, and blue pixels) such that pixel array 100 is capable of generating images based on red, green, and blue light received from a scene or emitted from a light-emitting layer 207.

In one suitable example, light-emitting layer 207 may be formed over all of the pixels of the first color, all of the pixels of the second color, and all of the pixels of the third color. If desired, light-emitting layer 207 may be formed over all of the pixels of the first color, none of the pixels of the second color, and none of the pixels of the third color. In one suitable arrangement, light-emitting layer 207 may be formed over all of the pixels of the first color, all of the pixels of the second color, and none of the pixels of the third color. In one exemplary arrangement, light-emitting layer 207 may be formed over all of the pixels of the first color, some but not all of the pixels of the second color, and none of the pixels of the third color. In one illustrative example, light-emitting layer 207 may be formed over all of the pixels of the first color, some but not all of the pixels of the second color, and some but not all of the pixels of the third color. In one suitable example, light-emitting layer 207 may be formed over all of the pixels of the first color, all of the pixels of the second color, and some but not all of the pixels of the third color. In one suitable configuration, light-emitting layer 207 may be formed over some but not all of the pixels of the first color, some but not all of the pixels of the second color, and some but not all of the pixels of the third color. In one exemplary scenario, light-emitting layer 207 may be formed over some but not all of the pixels of the first color, none of the pixels of the second color, and none of the pixels of the third color. In one illustrative arrangement, light-emitting layer 207 may be formed over some but not all of the pixels of the first color, some but not all of the pixels of the second color, and none of the pixels of the third color.

In the examples described above, "all of the pixels," "some but not all of the pixels," and "none of the pixels" may refer to an entire set of pixels 200 of a given color in pixel array 100, or may only refer to the pixels 200 in a given group or cluster of pixels in pixel array 100 (i.e., less than all of the pixels 200 in pixel array 100). If desired, the pixels of the first color may be red pixels, green pixels, or blue pixels, the pixels of the second color may be red pixels, green pixels, or blue pixels, and the pixels of the third color may be red pixels, green pixels, or blue pixels. In some arrangements that are sometimes described herein as an example, the first, second, and third colors are each different (i.e., pixel array 100 may include red, green, and blue pixels). In general, any of the patterns described above in connection with light-emitting layer 207 may be combined over all or a portion of pixel array 100 in any suitable arrangement or configuration. The photoluminescent layer 207 formed over a given pixel 200 may be tuned to absorb ultraviolet light of a given range of wavelengths and to emit visible light of a given range of wavelengths that corresponds to the range of wavelengths that the color filter element of the given pixel 200 is configured to transmit. In this way, pixel array 100 may generate image signals in response to any combination of visible and/or ultraviolet light that is received from a scene or that is emitted by a light-emitting material 207 for any combination of red, green, and blue light (or any other suitable range of wavelengths). If desired, image sensor 16 may generate images that include red, green, and/or blue portions that represent red, green, and/or blue light from a scene, as well as "false" red, green, and/or blue portions that represent ultraviolet light (of different wavelengths, for example) in the scene.

Figure 7:
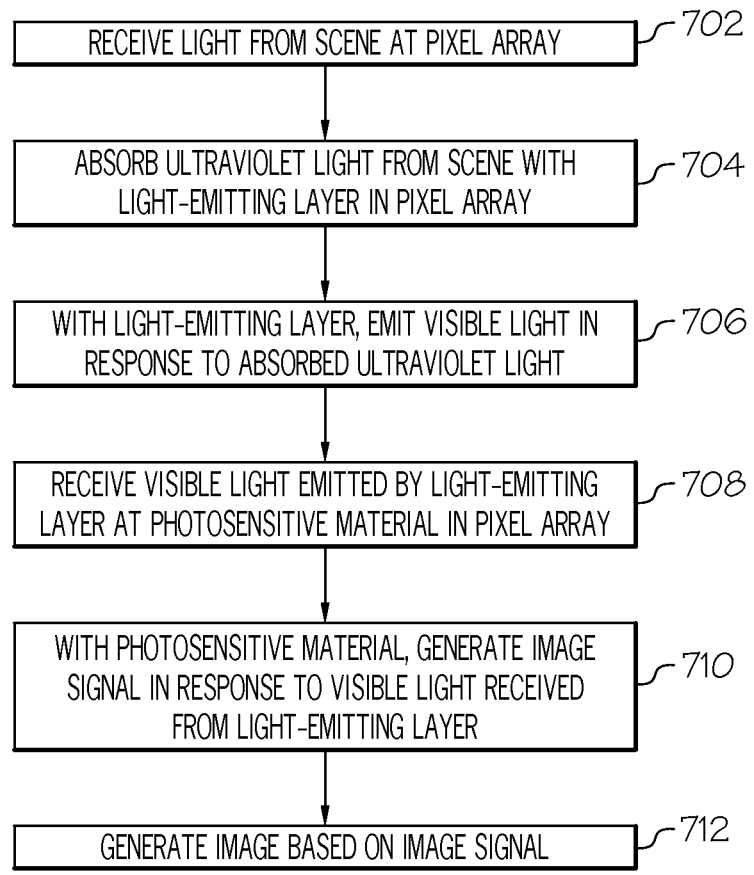
FIG. 7 is a flow chart of illustrative steps that may be performed by an imaging system to detect ultraviolet light and generate an image signal in response to the ultraviolet light using a photoluminescent layer in accordance with an embodiment of the present invention.

A flow chart of illustrative steps that may be performed in detecting and generating an image signal in response to ultraviolet light using an image sensor that includes a light-emitting layer is shown in FIG. 7.

At step 702, light from a scene that is to be captured using an image sensor may be received at a pixel array.

At step 704, ultraviolet light that is received at the pixel array may be absorbed by a layer of photoluminescent material (e.g., light-emitting layer 207).

At step 706, the layer of photoluminescent material may emit light of a visible wavelength in response to absorbing the ultraviolet light from the scene (e.g., layer 207 may effectively wavelength shift the ultraviolet light to visible light at desired visible wavelengths).

At step 708, the visible light emitted by the photoluminescent material may be received at a layer of photosensitive material in the pixel array.

At step 710, the photosensitive material may generate an image signal in response to the visible light that is received from the photoluminescent material.

At step 712, an image may be generated based on the image signal. In this way, an image in which ultraviolet and/or visible light that is present in a scene may be captured and visualized by a user.

Figure 8:
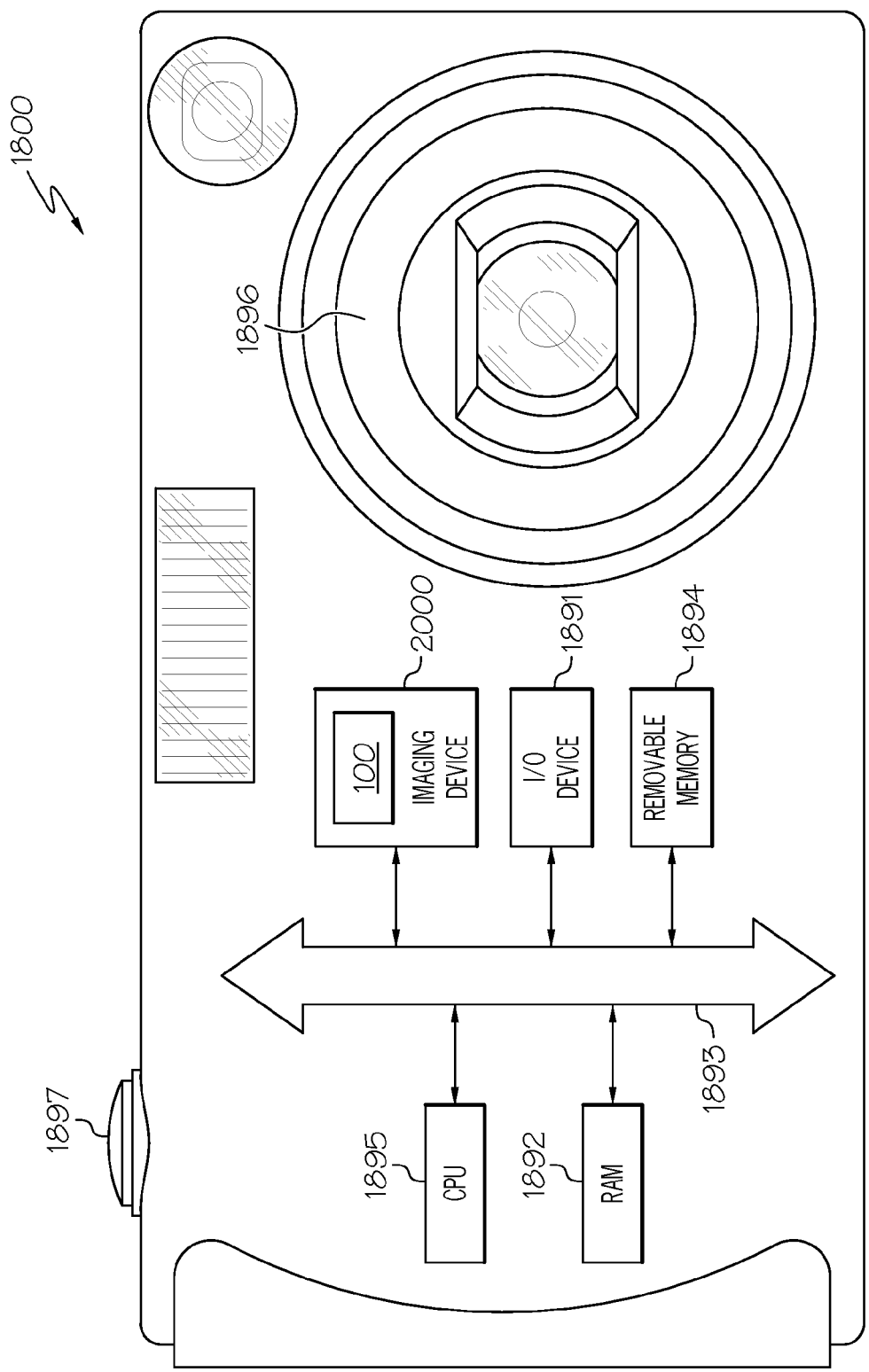
FIG. 8 is a block diagram of a processor system that may employ the embodiments of FIGS. 1-7 in accordance with an embodiment of the present invention.

FIG. 8 shows in simplified form a typical processor system 1800, such as a digital camera, which includes an imaging device 2000 (e.g., an imaging device 2000 such as image sensor 16 of FIGS. 1-6E employing image pixel array 100 having a light-emitting layer 207). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 1800 generally includes a lens 1896 for focusing an image on pixel array 100 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

An image sensor may include an array of image pixels arranged in rows and columns. The array of image pixels may include a layer of photosensitive material and a layer of light-emitting material that emits light onto the layer of photosensitive material. The layer of photosensitive material may be configured to generate electrical signals in response to at least the light emitted by the layer of light-emitting material.

If desired, the layer of light-emitting material may include a photoluminescent material that emits the light in response to receiving image light from a scene. If desired, the photoluminescent material may include silicon nitride.

If desired, the layer of light-emitting material may be configured to absorb image light from a scene and to emit the light in response to absorbing the image light. The image light may include light of a first wavelength band, and the light emitted by the layer of light-emitting material may include light of a second wavelength band that is different than the first wavelength band. If desired, the first wavelength band may include an ultraviolet wavelength band and the second wavelength band may include a visible wavelength band.

If desired, the array of image pixels may include microlens structures having upper and lower surfaces and a color filter layer formed between the layer of photosensitive material and the lower surface of the microlens structures. If desired, the layer of light-emitting material may be formed over the upper surface of the microlens structures. If desired, the layer of light-emitting material may be formed between the lower surface of the microlens structures and the color filter layer. If desired, the layer of light-emitting material may be formed over each of the image pixels in the array of image pixels. If desired, the color filter layer may include an array of color filter elements. A first color filter element in the array of color filter elements may transmit light of a first wavelength band to a first portion of the layer of photosensitive material corresponding to a first image pixel in the array of image pixels. A first portion of the layer of light-emitting material formed over the first portion of the layer of photosensitive material may be configured to emit light in the first wavelength band.

If desired, a second color filter element in the array of color filter elements may transmit light of the first wavelength band to a second portion of the layer of photosensitive material corresponding to a second image pixel in the array of image pixels. The layer of light-emitting material may not be formed over the second portion of the layer of photosensitive material.

If desired, a second color filter element in the array of color filter elements may transmit light of a second wavelength band that is different from the first wavelength band to a second portion of the layer of photosensitive material corresponding to a second image pixel in the array of image pixels. A second portion of the layer of light-emitting material formed over the second portion of the layer of photosensitive material may be configured to emit light in the second wavelength band.

If desired, a third color filter element in the array of color filter elements may transmit light of a third wavelength band that is different from the first and second wavelength bands to a third portion of the layer of photosensitive material corresponding to a third image pixel in the array of image pixels. A third portion of the layer of light-emitting material formed over the third portion of the layer of photosensitive material may be configured to emit light in the third wavelength band.

If desired, a fourth color filter element in the array of color filter elements may transmit light of the first wavelength band to a fourth portion of the layer of photosensitive material corresponding to a fourth image pixel in the array of image pixels. The layer of light-emitting material may not be formed over the fourth portion of the layer of photosensitive material.

A method of generating an image using a pixel array may include receiving image light in a first range of wavelengths from a scene with a pixel array, absorbing the received image light with photoluminescent material in the pixel array, emitting light in a second range of wavelengths that is different from the first range of wavelengths onto a photosensitive region in the pixel array with the photoluminescent material, generating an image signal in response to the emitted light in the second range of wavelengths with the photosensitive region, and generating an image based on the image signal.

If desired, the first range of wavelengths may include ultraviolet wavelengths and the second range of wavelengths may include visible wavelengths.

If desired, the received image light may include visible light. The method may include generating an additional image signal in response to the visible light received at the pixel array with the photosensitive region. Generating the image may include generating the image based on the image signal and the additional image signal.

If desired, the method may include receiving light of the second range of wavelengths from the scene with the pixel array. Generating the image signal with the photosensitive region may include generating the image signal in response to the light of the second range of wavelengths emitted by the photoluminescent material and in response to the light of the second range of wavelengths received from the scene.

The method may include filtering the image signal into first and second components with processing circuitry coupled to the pixel array. The first component may represent a first portion of the image signal generated in response to the light of the second range of wavelengths emitted by the photoluminescent material and the second component may represent a second portion of the image signal generated in response to the light of the second range of wavelengths received from the scene.

A system may include a central processing unit, memory, input-output circuitry, and an image sensor. The image sensor may include a region of photosensitive material that generates electrical signals in response to light and a layer of light-emitting material that emits light onto the region of photosensitive material.

If desired, the region of photosensitive material may generate the electrical signals at least partially based on the light emitted onto the region of photosensitive material by the layer of light-emitting material.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
   an array of image pixels arranged in rows and columns, wherein the array of image pixels comprises:
   a layer of photosensitive material;
   a layer of light-emitting material that emits light onto the layer of photosensitive material, wherein the layer of photosensitive material is configured to generate electrical signals in response to at least the light emitted by the layer of light-emitting material;
   microlens structures having upper and lower surfaces; and
   a color filter layer formed between the layer of photosensitive material and the lower surface of the microlens structures, wherein the color filter layer comprises an array of color filter elements, wherein a first color filter element in the array of color filter elements transmits light of a first wavelength band to a first portion of the layer of photosensitive material corresponding to a first image pixel in the array of image pixels, and wherein a first portion of the layer of light-emitting material formed over the first portion of the layer of photosensitive material is configured to emit light in the first wavelength band, wherein a second color filter element in the array of color filter elements transmits light of a second wavelength band that is different from the first wavelength band to a second portion of the layer of photosensitive material corresponding to a second image pixel in the array of image pixels, and wherein a second portion of the layer of light-emitting material formed over the second portion of the layer of photosensitive material is configured to emit light in the second wavelength band.

2. The image sensor defined in claim 1, wherein the layer of light-emitting material comprises a photoluminescent material that emits the light in response to receiving image light from a scene.

3. The image sensor defined in claim 2, wherein the photoluminescent material comprises silicon nitride.

4. The image sensor defined in claim 1, wherein the first portion of the layer of light-emitting material is configured to absorb image light from a scene and to emit the light of the first wavelength band in response to absorbing the image light, and wherein the image light comprises light of a third wavelength band that is different than the first and second wavelength bands.

5. The image sensor defined in claim 4, wherein the third wavelength band comprises an ultraviolet wavelength band and wherein the first wavelength band comprises a visible wavelength band.

6. The image sensor defined in claim 1, wherein the layer of light-emitting material is formed over the upper surface of the microlens structures.

7. The image sensor defined in claim 1, wherein the layer of light-emitting material is formed between the lower surface of the microlens structures and the color filter layer.

8. The image sensor defined in claim 1, wherein the layer of light-emitting material is formed over each of the image pixels in the array of image pixels.

9. The image sensor defined in claim 1, wherein a third color filter element in the array of color filter elements transmits light of a third wavelength band to a third portion of the layer of photosensitive material corresponding to a third image pixel in the array of image pixels, and wherein the layer of light-emitting material is not formed over the third portion of the layer of photosensitive material.

10. The image sensor defined in claim 1, wherein a third color filter element in the array of color filter elements transmits light of a third wavelength band that is different from the first, and second wavelength bands to a third portion of the layer of photosensitive material corresponding to a third image pixel in the array of image pixels, and wherein a third portion of the layer of light-emitting material formed over the third portion of the layer of photosensitive material is configured to emit light in the third wavelength band.

11. The image sensor defined in claim 10, wherein a fourth color filter element in the array of color filter elements transmits light of the first wavelength band to a fourth portion of the layer of photosensitive material corresponding to a fourth image pixel in the array of image pixels, and wherein the layer of light-emitting material is not formed over the fourth portion of the layer of photosensitive material.

12. A system, comprising:
a central processing unit;
memory;
input-output circuitry; and
an image sensor comprising:
  a region of photosensitive material that generates electrical signals in response to light;
  a layer of light-emitting material that emits light onto the region of photosensitive material; and
  a color filter layer that passes light to the region of photosensitive material, wherein the color filter layer comprises an array of color filter elements, wherein a first color filter element in the array of color filter elements transmits light of a first wavelength band to a first portion of the region of photosensitive material corresponding to a first image pixel, wherein a first portion of the layer of light-emitting material formed over the first portion of the region of photosensitive material is configured to emit light in the first wavelength band, wherein a second color filter element in the array of color filter elements transmits light of the first wavelength band to a second portion of the region of photosensitive material corresponding to a second image pixel, and wherein the layer of light-emitting material is not formed over the second portion of the region of photosensitive material.

13. The system defined in claim 12, wherein the region of photosensitive material generates the electrical signals at least partially based on the light emitted onto the region of photosensitive material by the layer of light-emitting material.

* * * * *

UNITED STATES PATENT AND TRADEMARK OFFICE
CERTIFICATE OF CORRECTION

PATENT NO. : 9,635,325 B2
APPLICATION NO. : 14/725121
DATED : April 25, 2017
INVENTOR(S) : Swarnal Borthakur It is certified that error appears in the above-identified patent and that said Letters Patent is hereby corrected as shown below:

On the Title Page

In the title, "ULTARVIOLET" should read --ULTRAVIOLET--.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*